(12) United States Patent
Kuo et al.

(10) Patent No.: US 8,941,085 B2
(45) Date of Patent: Jan. 27, 2015

(54) ELECTRON BEAM LITHOGRAPHY SYSTEMS AND METHODS INCLUDING TIME DIVISION MULTIPLEX LOADING

(71) Applicant: Taiwan Semiconductor Manufacturing Company, Ltd., Hsin-Chu (TW)

(72) Inventors: Ming-Zhang Kuo, Qionglin Township, Hsinchu County (TW); Ping-Lin Yang, Tianzhong Township, Changhua County (TW); Cheng-Chung Lin, Hsinchu (TW); Osamu Takahashi, Round Rock, TX (US); Sang Hoo Dhong, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/914,118

(22) Filed: Jun. 10, 2013

(65) Prior Publication Data
US 2014/0268078 A1    Sep. 18, 2014

Related U.S. Application Data

(60) Provisional application No. 61/781,891, filed on Mar. 14, 2013.

(51) Int. Cl.
*G21K 5/04* (2006.01)
*G03F 7/20* (2006.01)

(52) U.S. Cl.
CPC .................. *G03F 7/70208* (2013.01)
USPC .................. 250/492.3; 250/492.1; 250/492.2; 250/396 R

(58) Field of Classification Search
USPC ........ 250/396 R, 397, 396 ML, 492.1, 492.2, 250/492.21, 492.22, 492.23, 492.3
See application file for complete search history.

(56) References Cited

U.S. PATENT DOCUMENTS

2012/0286170 A1* 11/2012 Van De Peut et al. ........ 250/397

OTHER PUBLICATIONS

Paul Petric, Chris Bevis, Alan Brodie, Allen Carroll, Luca Grella, Mark McCord, Henry Percy, Keith Standiford and Marek Zywno, "REBL Nanowriter: Reflective Electron Beam Lithography," 2009, pp. 1-15, Proc. of SPIE vol. 7271, 727107, , Alternative Lithography Technologies.
Mark McCord, Paul Petric, Allen Carroll, Regina Freed, Marek Zywno and Chris Bevis, "Update on REBL Status for Direct Write Electron Beam Lithography," Jun. 29, 2009, pp. 1-27, KLA Tencorm Maskless Nanowriter HR0011-07-9-000.

* cited by examiner

*Primary Examiner* — Nicole Ippolito
(74) *Attorney, Agent, or Firm* — Haynes and Boone, LLP

(57) ABSTRACT

The present disclosure provides a systems and methods for e-beam lithography. One system includes an electron source operable to produce a beam and an array of pixels operable to pattern the beam. Control circuitry is spaced a distance from and coupled to the array of pixels. The control circuitry uses time domain multiplex loading (TMDL) to control the array of pixels.

18 Claims, 8 Drawing Sheets

ELECTRON BEAM LITHOGRAPHY SYSTEMS AND METHODS INCLUDING TIME DIVISION MULTIPLEX LOADING

CROSS-REFERENCE

This application claims priority to U.S. Provisional Patent Application Ser. No. 61/781,891, filed on Mar. 14, 2013, and entitled "Electron Beam Lithography Systems And Methods Including Time Division Multiplex Loading," the entire disclosure of which is hereby incorporated herein by reference.

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, stricter demands have been placed on lithography process. For example, techniques such as immersion lithography, multiple patterning, extreme ultraviolet (EUV) lithography, and e-beam lithography have been utilized to support critical dimension (CD) requirements of the smaller devices. In particular, one such example is high throughout electron beam writer systems operable to use mask-less lithography processes. This e-beam system may use complementary-metal-oxide-semiconductor (CMOS) devices with an array of controllable pixels, which can act as an array of electron mirrors. Using this device, the system can generate a pattern to be written on a target substrate by reflecting an electron beam off the array of mirrors where the pixels of the array are turned off or on. The size of the patterned image is dependent on the pixel size however, and typical pixel sizes are limited due to the functionality required by each pixel. Accordingly, although existing lithography methods have been generally adequate, they have not been satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Additionally, directional terms such as up, down, left, right, diagonal, are provided for relative reference only and do not implicate an absolute direction. Various features may be arbitrarily drawn in different scales for simplicity and clarity.

Figure 1:
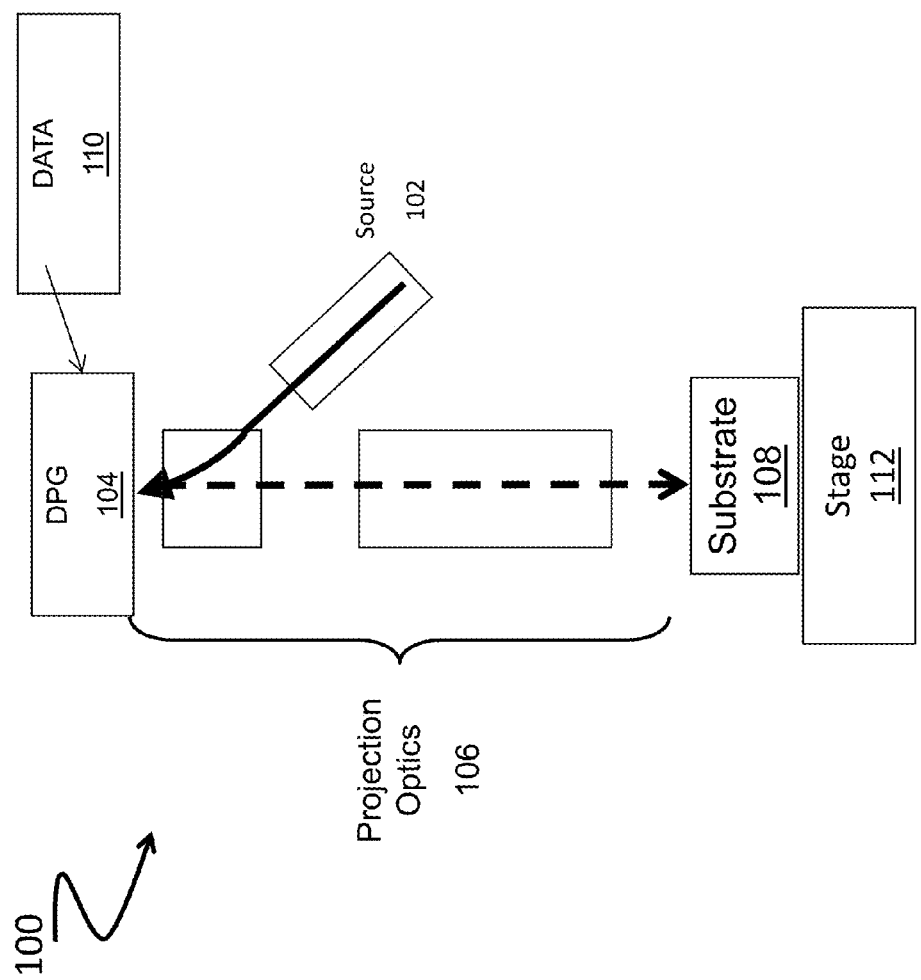
FIG. 1 is simplified diagrammatic illustration of an embodiment of a lithography system according to one or more aspects of the present disclosure.

Illustrated in FIG. 1 is an embodiment of an electron beam lithography system 100. The e-beam system 100 provides for a beam of electrons being incident a target surface in a patterned manner. The target surface is typically covered with a photosensitive material also referred to as a resist. The patterned resist is then developed to selectively remove either the exposed or non-exposed regions of the resist. This forms masking elements of the resist which are used to pattern underlying layers, typically by suitable etching processes such as dry etch, plasma etch, and/or wet etch.

The lithography system 100 includes an electron beam source (also referred to as an electron gun) 102, a digital pattern generator (DPG) 104, a projection optics system 106, and a target substrate 108. The target substrate 108 is placed on a wafer stage 112. Data 110 is provided to the DPG 104. The arrangement of components in the system 100 is exemplary only and not intended to be limiting. Furthermore, additional components may be added and/or components omitted. The solid lines illustrate the illuminating beam from the electron gun 102 to the DPG 104. The dashed lines illustrate the modulated reflective beam from the DPG 104 to the substrate 108.

The target substrate 108 may be a semiconductor wafer. The substrate 108 may be a silicon substrate. Alternatively, the substrate 108 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The target substrate 108 has a photosensitive layer formed thereon.

The wafer stage 112 may be operable to move the substrate 108 in a plurality of directions including linearly (laterally and diagonally) and/or rotary-fashion. The movements of the substrate 108 may provide a scan direction (e.g., a movement of an incident beam on the target substrate). This movement is described in further detail with reference to FIG. 8 below.

The electron gun 102 provides a source of electrons in one or more beams. The source of electrons may include $LaB_6$, $W/ZrO_2$, and/or other sources. The projection optics system 106 may include a plurality of lens. The lens may include, for example, electrostatic and magnetic lenses such as, transfer lens, demagnification lens, cathode lens, magnification lens, condenser lens, and/or other suitable lens. The projection optics system 106 may also include a magnetic prism and/or other suitable functionality. In an embodiment, approximately 5× magnification of the beam from the gun 102 to the DPG 104 is provided. In an embodiment, approximately 50× in demagnification is provided from the DPG 104 to the substrate 108.

Data 110 is provided to the DPG 104 to determine the generated pattern to be provided by the beam, and subsequently formed onto the substrate 108. The data 110 may represent a semiconductor device such as an integrated circuit (IC) device. The IC may include a device such as a static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. The data 110 may be an IC database file such as a layout file. The data 110 may be IC data generated as a computer file, for example, as a graphic database system (GDS) type file, as an open artwork system interchange standard (OASIS) type file, and/or as any appropriate type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools including the system 100.

The DPG 104 includes a CMOS-based device or chip with multiple pixels, each pixel being independently operable to be "on" or "off". The multiple pixels are arranged in an array. Each pixel includes an electron mirror. Thus, the pixels act as a mirror array. For example, when a pixel is in an "on" state, the e-beam can be directed through the pixel also referred to as absorbed. When the pixel is in an "off" state, the e-beam may be blocked from going through the pixel, also referred to as reflected. During the lithography process, the e-beam is directed to the pattern generator, the pattern generator is controlled to independently turn on or off each pixel by a control circuit coupled with each pixel and addressing each pixel. The controlled pixel status is determined by the data 110. The pixel may be turned off/on by sending "data" to the pixel for example, applying a voltage potential to the pixel (e.g., 2V).

The system 100 may use the DPG 104, which has binary (on/off) pixels, to provide a gray tone exposure to provide a pattern on the substrate 108. For example, as the substrate 108 moves under the beam, the pattern of pixels on the DPG 104 shifts so that the electrons reflected from successive pixels of a row on the DPG can be incident the same spot on the wafer. The shifting of the pattern requires the DPG 104 to include information as to what the successive data to be provided to the pixel will be. This is discussed in further detail below.

One reflective electron beam lithography tool, such as the system 100, is described in further detail in *REBL Nanowriter: Reflective Electron Beam Lithography*, by Petrie et al., Proc. of SPIE Vol. 7271, which is hereby incorporated by reference in its entirety.

Figure 2:
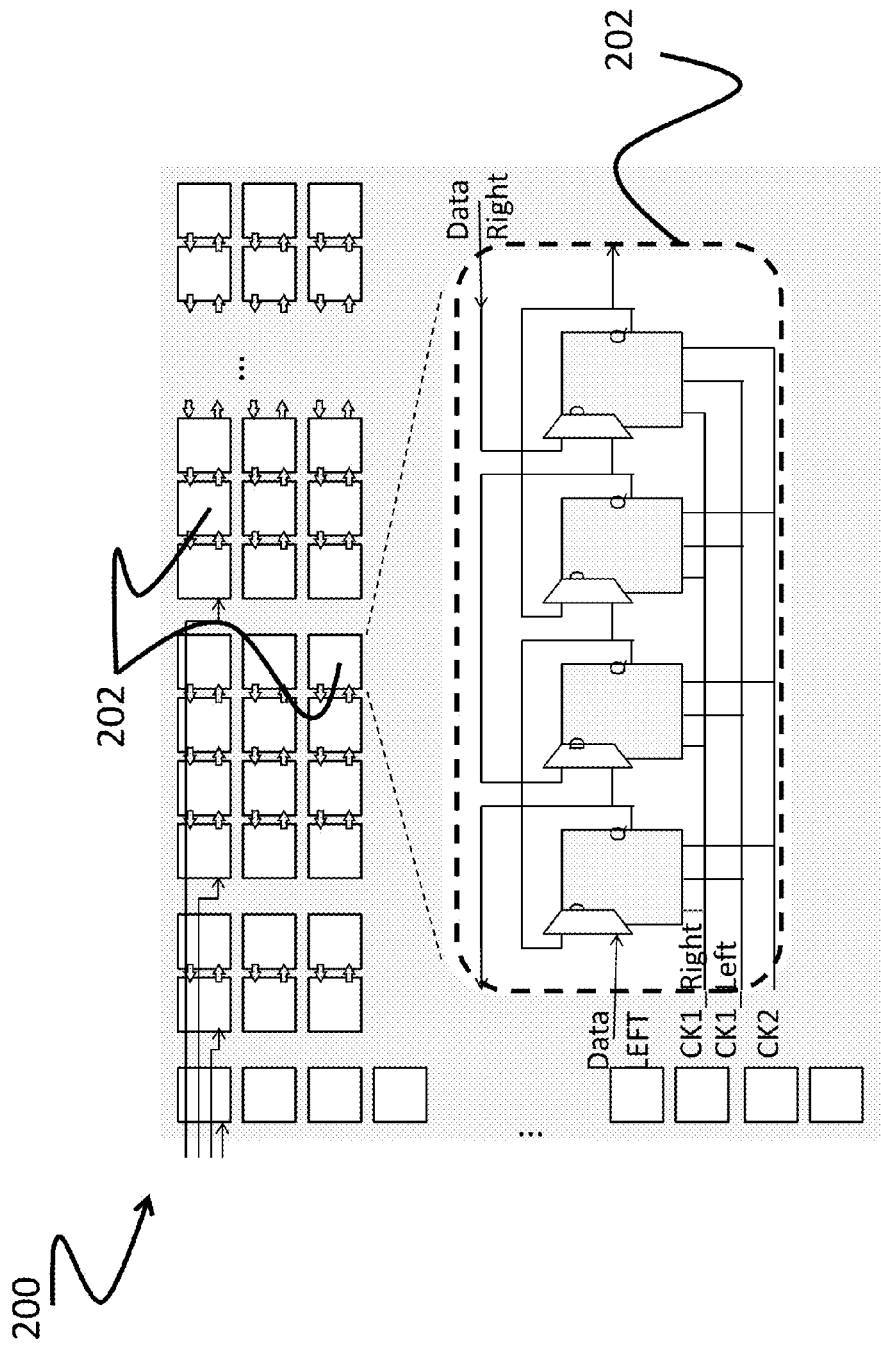
FIG. 2 is a conventional pixel array structure.

Referring now to FIG. 2, illustrated is a conventional embodiment of a pixel array 200 that may be used in a digital pattern generator of an e-beam tool, such as in the DPG 104 of the system 100, described above with reference to FIG. 1. In the pixel array 200, each pixel 202 of the mirror array includes the control circuitry to support illumination control including the shifting required during illumination (e.g., left and right) as described above with respect to the gray-scale imaging. Thus, each pixel cell 202 provides for illumination control and bi-directional shift. To support the bi-directional shift, the pixel cell includes a 2 to 1 multiplexer (MUX) to select data as it comes from the right or as it comes from the left. The pixel cell 202 also includes a storage cell to support illumination control.

Specifically, the pixel cell 202 is a mux-flip-flop which has two data inputs and three clock inputs. The CK1Right and CK1Left are the clocks to select data from the right of left respectively. The CK2 clock signal is used to latch selected data into the storage cell of the pixel cell 202. Also received by each pixel cell 202 is Data Left and separately, Data Right. Thus, the pixel cell 202 combines illumination control and shift function into each pixel cell 202. The cell 202 may require 12 or more transistors to accomplish its function.

In this conventional embodiment, there are significant limitations. For example, shrinking the pixel cell 202 size of the pattern generator is very difficult or significantly limited as each pixel cell 202 has its own control circuitry. Particularly, the pixel control circuit is disposed approximate to an active portion of the pixel (such as a pad/mirror element of the pixel) and occupies a certain surface area of the pixel, thus, shrinking by scaling down has a limit due to the surface area conflict. Thus, what is needed is a configuration allowing for a smaller pixel size. A smaller pixel size can provide for a DPG, such as DPG 104 of the system 100, having a finer resolution and thus, provides for forming finer resolution patterns on a target substrate.

Figure 3:
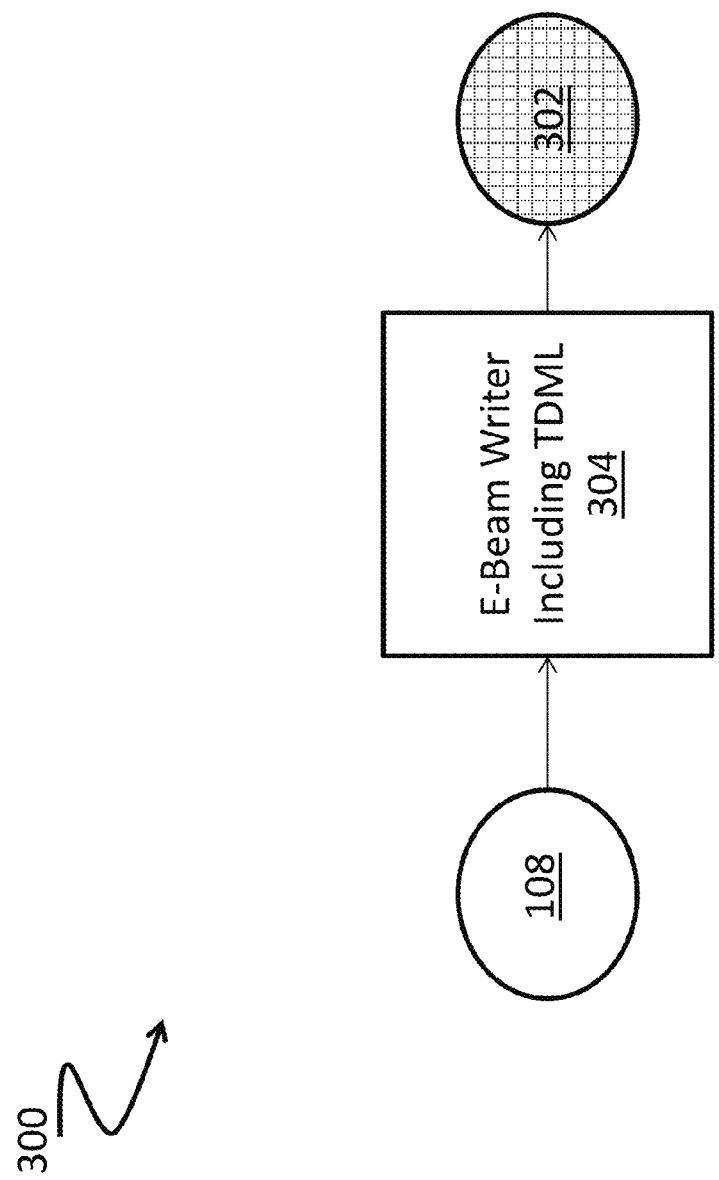
FIG. 3 is a block diagram illustrating a system of lithography according to one or more aspects of the present disclosure.

Referring now to FIG. 3, illustrated is a lithography system 300 that includes an electron beam writer tool 304. A target substrate, or wafer, 108 is provided to the e-beam tool 304. The substrate 108 has a photosensitive layer disposed thereon. The substrate 108 may be substantially similar to as discussed above with reference to FIG. 1. The e-beam writer tool 304 may be a reflective electron beam lithography tool substantially similar to as discussed above with reference to the system 100 of FIG. 1. The target substrate 108 is provided to the tool 304, which patterns the target substrate 108 (e.g., exposes the photosensitive layer to a pattern of radiation) providing the patterned substrate 302.

In the system 300, the e-beam writer tool 304 uses time division multiplex loading (TDML) to perform the exposure process. Time division multiplex loading includes digital multiplexing. TDML allows for transmitting a plurality of digital signals over a common channel. In other words, multiple digital signals are provided on a common channel (or data path) where the signals physically take turns (in time) on the channel. For example, multiple data indicating the state of the mirror pad of different pixel cells may be transferred on the same channel at different times (times which are controlled by an accompanying clock signal).

In an embodiment, the e-beam tool 304 uses a digital pattern generator (DPG). The DPG may include a CMOS-based device (e.g., chip) with multiple pixels arranged in an array. The pixels each include a mirror pad (e.g., electron mirror) which is operable to be "on" or "off". Thus the pixel array acts as a mirror array. For example, during the lithography process, the e-beam is directed to the pattern generator, the pattern generator is controlled to independently turn on or off each pixel by a control circuit coupled with each pixel and addressing each pixel. For example, when a pixel is in an "on" state, the e-beam can be absorbed by the pixel. When the pixel is in an "off" state, the e-beam is reflected by the pixel. The controlled pixel status is determined by design data. The pixel may be turned off/on by applying a small voltage potential to certain pixels.

The e-beam tool 304 of the system 300 may include a DPG that has a control circuit that implements time division multiplex loading (TDML) to control the pixel states. In an embodiment, TDML is used to control the pixels such that the data is selected and designated for a particular pixel using circuitry (e.g., logic circuitry) outside of the pixel region, thereby allowing for a pixel cell that is only a storage cell. (In contrast, see FIG. 2, which includes a storage cell and control circuitry.) Thus, using TDML to control the pixels allows for shrinking each pixel cell size, thereby achieving finer resolution of the system 300.

The TDML includes circuitry to receive data that defines the pixel state required during the scan. The TDML may then use a high speed multiplexer and/or logic circuitry such as shift logic to select and send the appropriate data to each of the pixel cells. The logic circuitry needed to implement the TDML control of the pixels may be implemented outside of the pixel array portion of the CMOS-device (e.g., chip). For example, the logic may be implemented in a peripheral region of the chip. Exemplary embodiments are discussed below.

Figure 4:
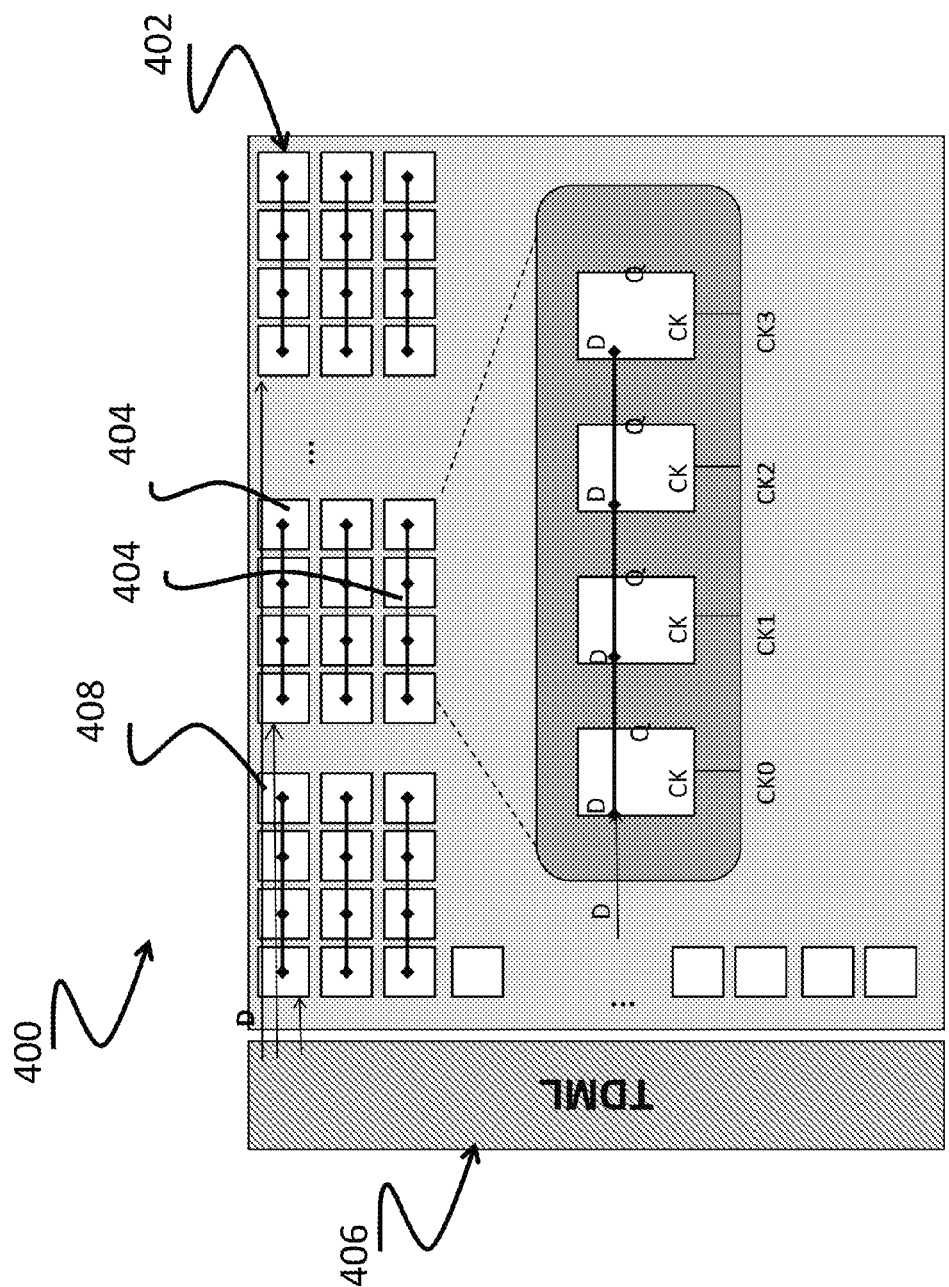
FIG. 4 illustrates a block diagram of an embodiment of a pattern generating device according to one or more aspects of the present disclosure.

First, referring to FIG. 4, illustrated is an embodiment of a pattern generator (PG) device 400. The pattern generator device 400 may be used in an e-beam writer tool. In an embodiment, the pattern generator device 400 is used as a digital pattern generator such as DPG 104 of the system 100, described above with reference to FIG. 1. The PG device 400 includes a pixel array region 402 having a plurality of pixel cells 404. The pixel cells 404 are arranged in a 2-D array 402 having rows (e.g., vertically arranged) and columns (e.g., horizontally arranged).

In an embodiment, PG device 400 may be a CMOS-based device (e.g., chip). The pixel array 402 acts as a mirror pad array. For example, each pixel cell may include a mirror pad. For example, when a pixel cell 404 is in an "on" state, the e-beam can be directed through (absorbed by) the pixel cell 404. When the pixel cell 404 is in an "off" state, the e-beam is blocked reflected by the pixel cell 404. During the lithography process, the e-beam is directed to the pixel array 402, and patterned according to the status of the pixel cells 402 that the e-beam is incident. While the process is ongoing, the PG device 400 is operable to independently turn on or off each pixel cell 404 according to data defined by the target pattern to be formed.

In the PG device 400, each pixel cell 404 is controlled by a TDML-based control circuit 406 coupled with the pixel 404. The TDML-based control circuit 406 may turn each pixel cell 404 off/on by applying data to the designated pixel cell 404. The data may include small voltage potential. As illustrated in FIG. 4, the system 400 includes a plurality of data paths 408. Each data path 408 is connected to a plurality of pixel cells 404. Specifically, one data path 408 is provided for each grouping of pixel cells. In an embodiment, one data path 408 is provided for a group of pixel cells in a given row. (Groupings of pixels cells are discussed in further detail below with reference to FIG. 7.) Each pixel cell 404 also receives a respective clock line as illustrated in the inset detailed view of a plurality of pixel cells. The clock signal may indicate when to acquire data (and thus, what data to acquire) from the shared data path 408. The pixel cell 404 is discussed in further detail with reference to FIG. 5.

The TDML-based control circuit 406 may include multiplexers, shift logic, and/or other suitable electronic devices operable to provide the data and associated clock signals to the pixels. The TDML-based control circuit is described in further detail below with reference to FIG. 6. The TDML-based control circuit 406 is also operable to identify and select the data from the appropriate direction to be delivered to the pixel 404. This would include data from the left and data from the right, functionality provided by the array of FIG. 2. In addition, the TDML-based control circuit could select from data provided from any plurality of directions, as discussed in further detail with reference to FIG. 8.

Figure 5:
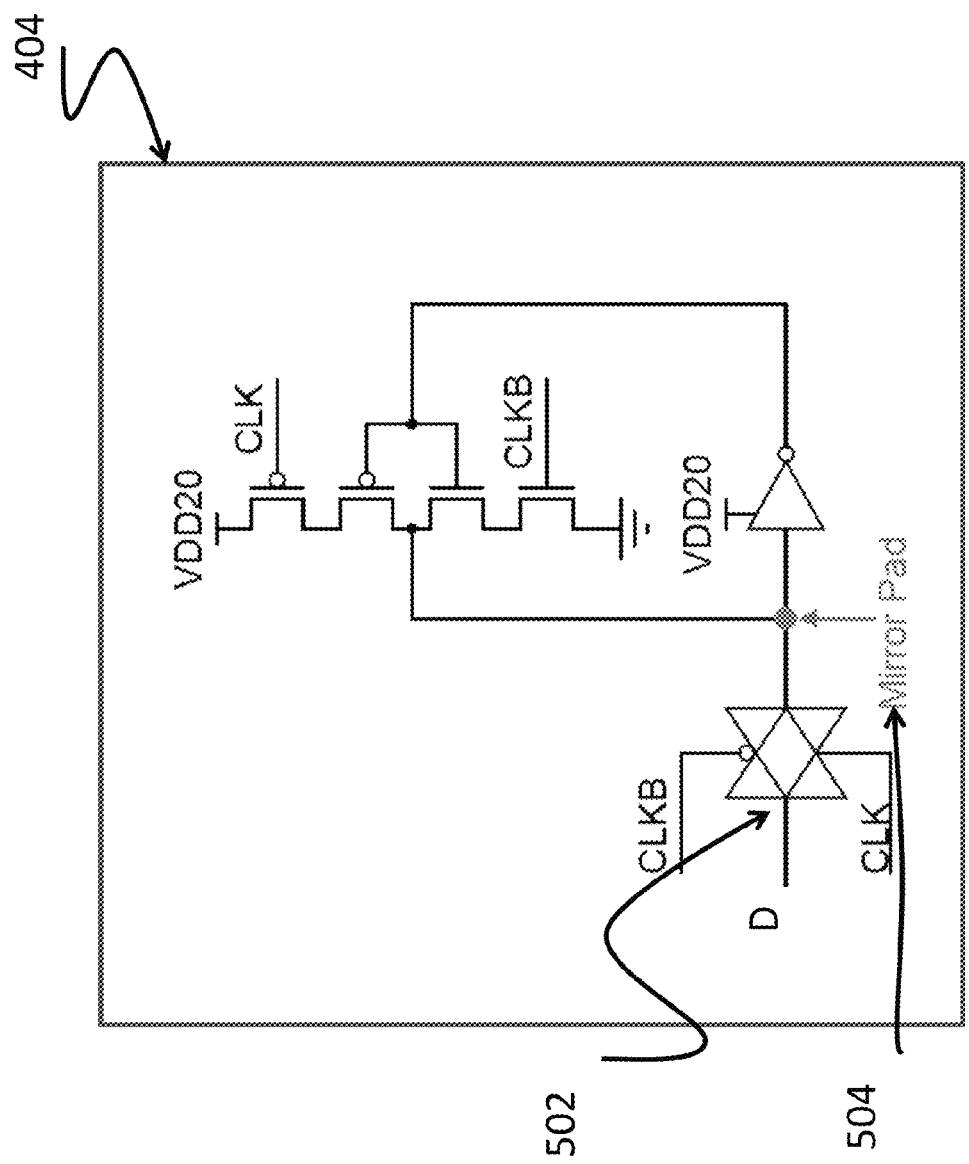
FIG. 5 illustrates a circuit diagram of an embodiment of a pixel cell according to one or more aspects of the present disclosure.

As indicated above, the pixel cell 404 of the array 402 includes circuitry operable to receive and store the state ("on"/"off") (also referred to as data) provided to the pixel cell 404. Each pixel cell 404 receives a clock signal CLK and data D (see FIG. 4). FIG. 5 illustrates the pixel cell 404 in greater detail. As illustrated, the pixel cell 404 includes 8 transistors as in input/output device or latch. The pixel cells' latch circuit 404 receives the CLK (CLKB (bar) being its inverse) and data D. The device 502 also referred to as transmission or passing gate 502, on the appropriate CLK signal, acts upon the state of the mirror pad 504 of the pixel. The state of the mirror pad 504 controls whether the e-beam will be absorbed by the pixel cell or blocked/reflected.

Thus, in an embodiment, the pixel cell 404 does not include circuitry as to choose which data to load (e.g., from the right or left). As such, the pixel cell 404 does not include a multiplexer. This may allow for its decrease in size. In other words, the pixel cell 404 may include a single data input and a single clock input. In an embodiment, the pixel cell 404 is a latch.

Figure 6:
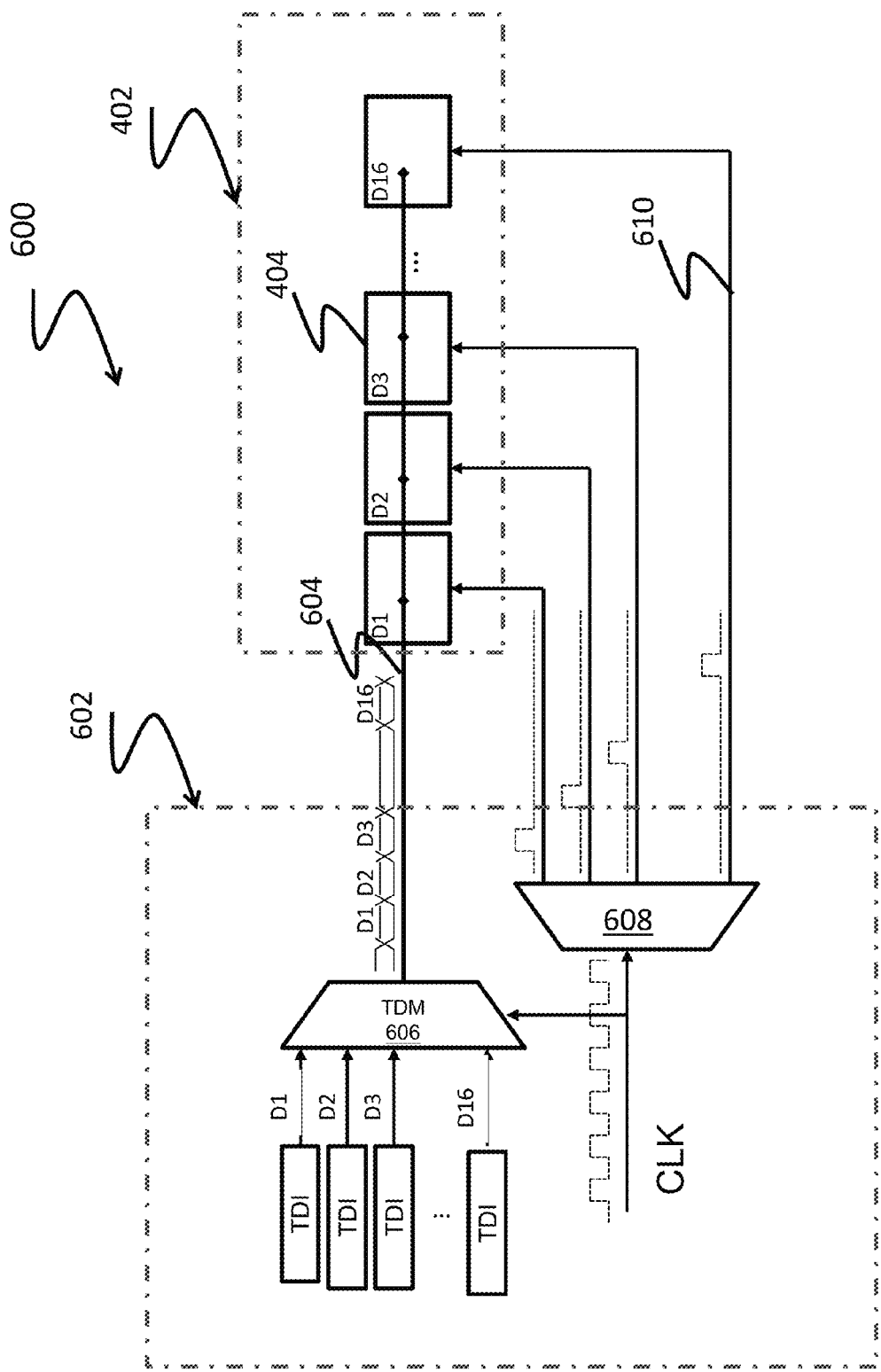
FIG. 6 illustrates a block diagram of an embodiment of time domain multiplex loading system according to one or more aspects of the present disclosure.

Referring now to FIG. 6, illustrates is a TDML system (circuitry) 600. The TDML system 600 may be provided in the lithography system 100, described above with reference to FIG. 1. Specifically, the TDML system 600 may be implemented in the DPG 104 of the system 100, also described above with reference to FIG. 1. The TDML system 600 may also be the TDML system of the e-beam tool 304 of system 300, described above with reference to FIG. 3.

The TDML system 600 includes a TDML circuitry 602 that is coupled to a pixel array 402. One row of the array 402 of pixels 404 is illustrated in FIG. 6. The array 402 and the pixels 404 may be substantially similar to as discussed above with reference to FIGS. 4 and 5. During an e-beam lithography process, the TDML system 600 is operable to independently turn on or off each pixel cell 404 according to data defined by a target pattern to be formed. The system 600 provides data D1, D2, D3, etc. that defines the state of the pixels. This data D1, D2, D3, etc., may be generated using design data such as the design data 110, described above with reference to FIG. 1. The time domain interface (TDI) circuitry may receive the data. In an embodiment, the TDI circuitry may also include circuitry to select the appropriate data (e.g., data from a given direction) based on the lithography process performed (e.g., selects the data corresponding to the scan direction being used). For example, in an embodiment, the TDI circuitry selects the data from the right or from the left direction as appropriate.

A multiplexer, also referred to as a time domain multiplexer, 606, the places data selected for each of a plurality of pixels 404 of a row of the array 402 on one signal line or bus 604, which is coupled to the plurality of pixel cells 404. Line 604 may also be referred to as a data path. The line 604 may be substantially similar to the line 408, discussed above with reference to FIG. 4. As illustrated, D1 is designated to be stored at a first pixel cell, D2 at a second pixel cell, and so forth. The data is sent to the respective cells 404 through the data path line 604 at a clock speed. The high speed clock CLK is also provided to the multiplexer 606 to deliver the data. As illustrated, in an embodiment, the data path 604 provides data for multiple pixels on a given row of the array 402.

The CLK is also provided to a demultiplexer 608. The demux 608 provides a different clock pulse or signal to each of a plurality of cells to latch the respective data. In an embodiment, a 1.6 GHz CLK is provided, which delivers a clock at 100 MHz to each of the plurality of cells 404. As illustrated, in an embodiment, the pixel cells 404 that share the data path line 604 each have a separate clock signal, illustrated as separate clock paths 610.

Thus, the TDML circuitry 602 aligns a data and clock signal to allow for acquisition of the appropriate data D by the appropriate pixel 404 using the CLK signal. As illustrated in FIG. 5, this allows each pixel 404 to operate as a storage device without requiring additional control circuitry.

Figure 7:
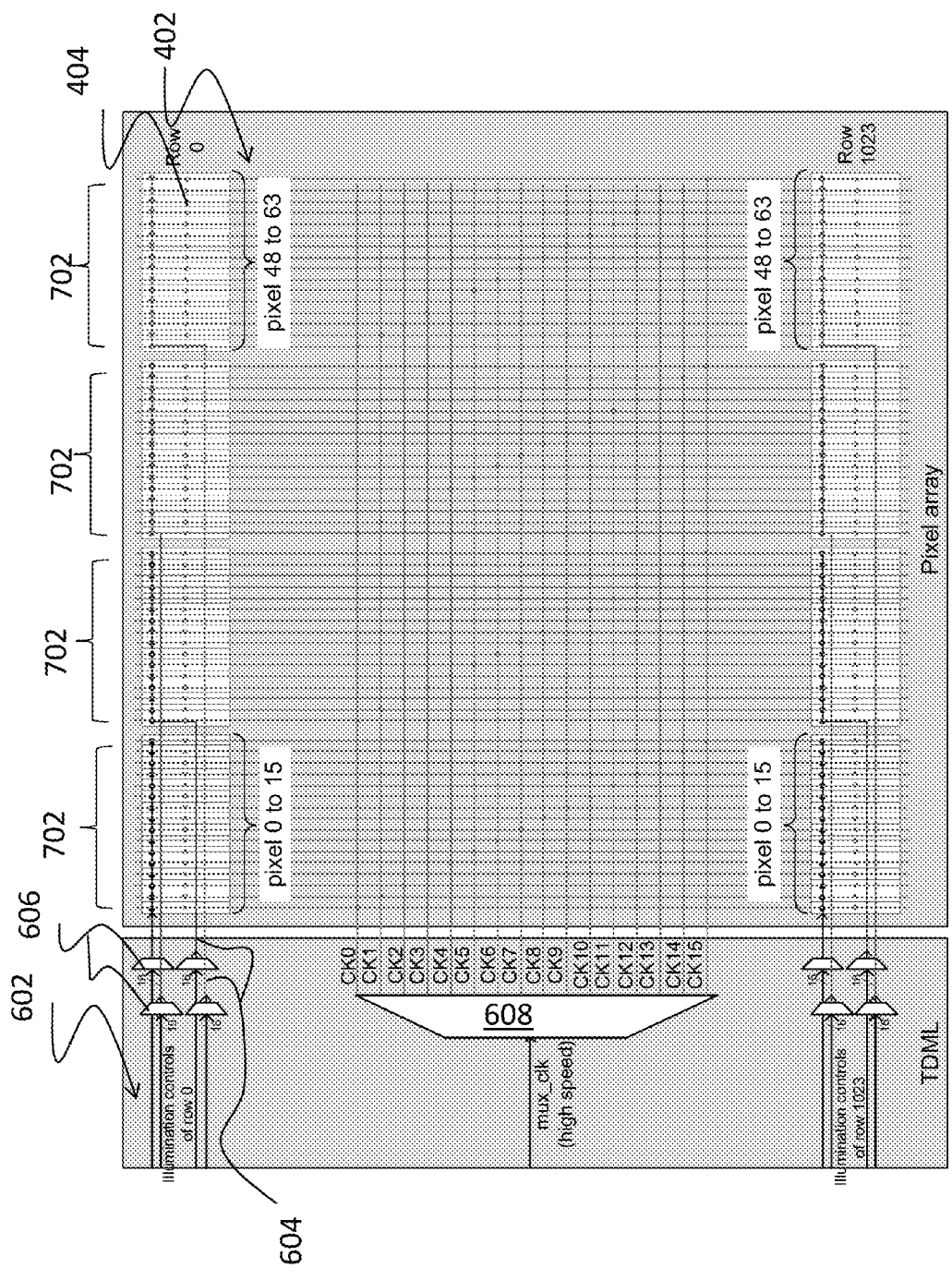
FIG. 7 illustrates a block diagram of an embodiment of a patterning generating device according to one or more aspects of the present disclosure and including an array having a plurality of groupings.

Referring now to FIG. 7, illustrated is a pattern generator (PG) system 700. In an embodiment, the PG system 700 is formed on a single chip such as, a CMOS chip. The PG system 700 includes a pixel array 402 having the TDML system 602 controlling the array 402. The size of the pixel array 402 as illustrated is 1024×64. However, this size is exemplary only and not intended to be limiting. The pixels in each row of the array are designated into groups 702. In the illustrated embodiment, four groups 702 are provided per row. In an embodiment, each group 702 has 16 pixel cells 404 (see the notation of pixel 0 to 15). Again, this grouping is for explanatory purposes and not intended to be limiting. Each of the groups 702 of pixel cells 404 has TDML circuitry in the TDML region of the system that provides for selecting and sending data to the pixel cells. Specifically, a time domain multiplexer 606 is coupled to each of the groups 702 in the row. Each time domain multiplexer 606 provides data on a data path 604 that is shared by the pixels 404 of a given group 702.

A clock demux 608 is provided that is operable to produce a clock signal/pulse for each pixel cell 404 of a group 702 (e.g., 16 clock signals as illustrated). In an embodiment, the clock signal received by the clock demux 606 is 1.6 GHz. In a further embodiment, the clock signals generated (e.g., CK0-CK15) are each 100 MHz.

It will be appreciated that the array of pixels may be of any size. For example, the array may be expanded by adding more groups and thus, additional wiring and TDM circuitry 602 circuitry, for example, by providing additional data paths and additional mux 606 circuitry. In an embodiment, a higher speed clock may be provided to the demux 606 and thus, additional clocks generated allowing for additional pixel cells 404 in each grouping 702. Thus, one will recognize a tradeoff between array size, clock speed, and wiring required for various array sizes.

Figure 8:
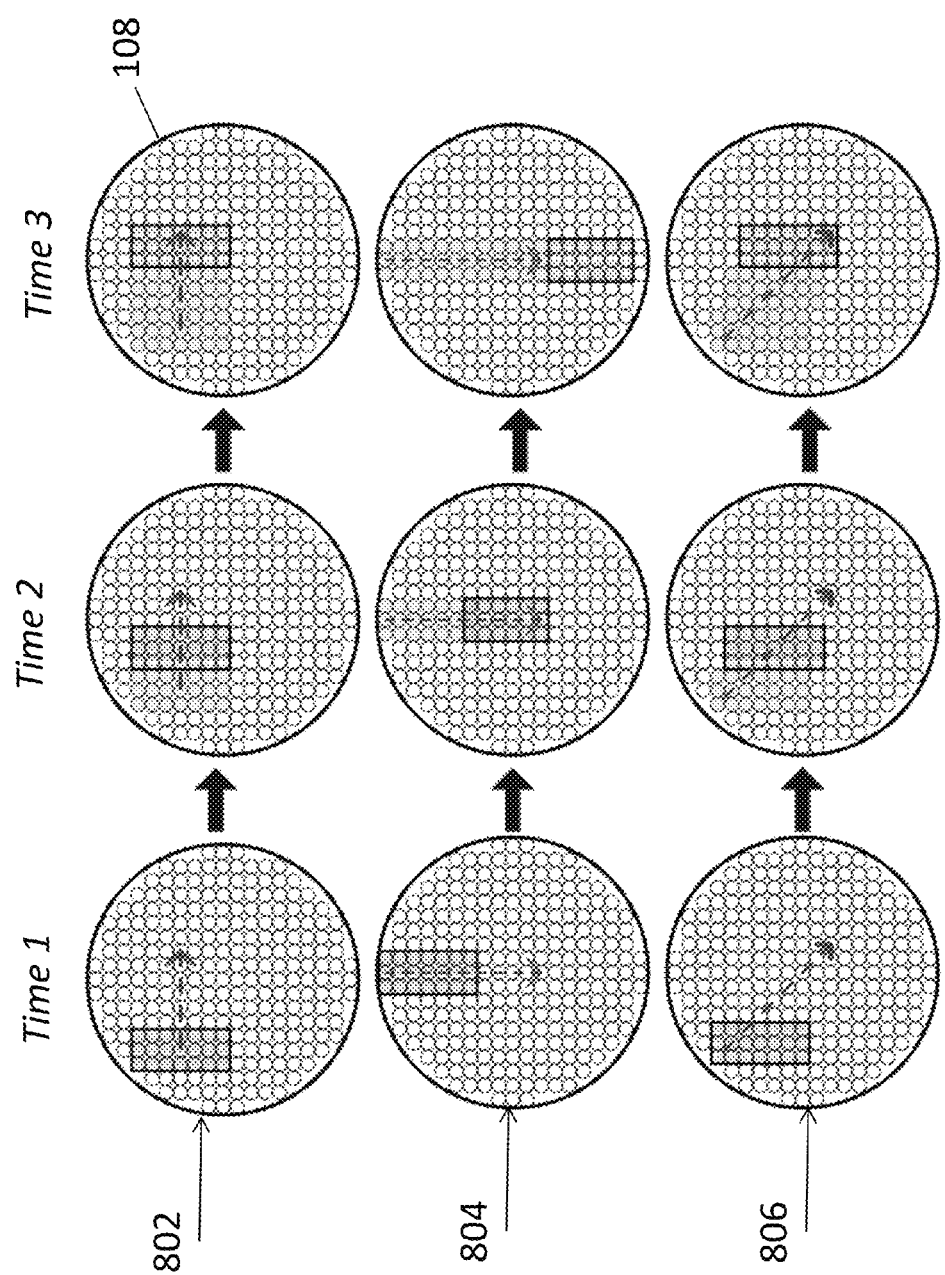
FIG. 8 illustrates a plurality of exemplary scan directions for a substrate operable to be performed according to one or more aspects of the present disclosure.

Referring now to FIG. 8, illustrated is a plurality of movements (also referred to as scan directions) that may be provided of a target region during a lithography process. In an embodiment, the movements and/or exposure region may be provided by the system of FIG. 1 using one or more aspects of the present disclosure. In an embodiment, a stage may be operable to hold a wafer may be operable to move the wafer as exemplified in scan directions 802, 804, and 806.

The movements of the target regions for exposure may be used to provide a gray tone exposure. For example, a system such as the system 100 may use the DPG 104, which has binary pixels, to provide a gray tone exposure to provide a pattern on the substrate 108. For example, as the substrate 108 moves under the beam, the pattern of pixels on the DPG 104 shifts so that the electrons reflected from successive pixels of a row on the DPG can be incident the same spot on the wafer. Thus, it is necessary that the pixels be operable to receive data from multi-directions in order to allow for the lithography process to occur in multi-directions 802, 804, and 806 on the substrate 108.

Specifically, movement 802 illustrates a left-and-right scan direction of a target region on a substrate 108 during a scanning process. The shaded regions showing portions of the substrate 108 where an e-beam has been incident. Movement 804 illustrates an up-and-down scan direction of a target region on a substrate 108 during a scanning process. The shaded regions showing portions of the substrate 108 where an e-beam has been incident. Movement 806 illustrates a diagonal scan direction of a target region on a substrate 108 during a scanning process. The shaded regions showing portions of the substrate 108 where an e-beam has been incident. Various other movements are possible and within the scope of the present disclosure.

Each of the movements 802, 804, and 806 may be supported by a lithography system that employs the TDML system of the present disclosure. For example, by providing TDML circuitry such as described above in FIGS. 6 and 7, sufficient area and circuitry may be provided to address data from any direction (see TDML 602). For example, additional logic may be added to address the receipt of data associated with multiple directions. The additional logic may provide for the selection of what data (D) is provided to a particular pixel based on a scan direction implemented (e.g., actually used). In an embodiment, this logic is added in a region peripheral to the array. (In contrast, in FIG. 2, additional logic and multiplexers would require increasing the pixel size such that it may make it inefficient or ineffective to have each pixel determine what data (or the multiple possible directions) to store or latch.)

In summary, the methods and devices disclosed herein provide systems and methods for using time domain multiplexing to deliver data to an array of pixels (mirror array). The mirror array may be provided in a pattern generator of an e-beam tool. For example, each of FIGS. 4, 5, 6, 7, and 8 may be provided in the system 100, described above with reference to FIG. 1, and/or in system 300, described above with reference to FIG. 3. Specifically, the elements of FIGS. 4, 5, 6, and 7 may be provided in a device such as a CMOS chip(s) providing a pattern generator such as, for example, the DPG 104 of the system 100.

In doing so, the present disclosure offers several advantages over prior art devices. Advantages of some embodiments of the present disclosure include allowing for a reduced pixel cell size as the pixel can provide for storage and the pad mirror functionality only, without requiring circuitry to select a type of data. Not only does this make the pixel cell size variable, it may improve the cell's robustness, for example, decreasing reliability issues. Another advantage of some embodiments is that disposing the control circuitry outside of the pixel region allows for more powerful (shift) logic and/or larger multiplexer circuitry to be implemented without decreasing the resolution provided by the pixel array. This allows for any directional shift to be accounted for by the control circuitry (see FIG. 8).

Thus, it will be appreciated that in one of the broader forms of the systems of the present disclosure a system is provided that includes an electron source operable to produce a beam.

The system further includes an array of pixels operable to pattern the beam. Control circuitry is spaced a distance from and coupled to the array of pixels. The control circuitry uses time domain multiplex loading (TMDL) to control the array of pixels.

In a further embodiment, the control circuitry using TDML includes a multiplexer and a single data path coupled to the multiplexer and to each of a first pixel and a second pixel of the array of pixels. The system may further include a first clock signal provided to a demultiplexer (demux). The demux may use the first clock signal to generate a second clock signal which is provided to the first pixel and a third clock signal provided to the second pixel. It is noted that these clock signals may be used to transmit and receive the data.

In an embodiment, the system includes control circuitry that provides a first clock signal provided to a demultiplexer (demux). The demux can generate a plurality of clock signals used to provide data to the array of pixels.

In an embodiment, the array of pixels in the system is split into a first group of pixels and a second group of pixels. The first group of pixels may share a first data path and the second group of pixels shares a second data path. See, e.g., FIG. 7. In a further embodiment, each of the pixels of the first group receives a separate clock signal.

In an embodiment of the system, each pixel of the array of pixels receives a single data path and a clock signal. See, e.g., FIG. 5. The pixel may include a register or a latch to receive data from the single data path and the clock signal.

In an embodiment, the system can include control circuitry that is operable to receive a first data associated with a right direction scan of the system and a second data associated with a left direction scan of the system. Shift logic circuitry may then select one of the first and the second data. A data path for delivers the selected one of the first and the second data to a first pixel of the array of pixels. In yet a further embodiment, the circuitry is also operable to receive a third data associated with an up direction, a down direction, or a diagonal direction scan of the system. The shift logic circuitry is also operable to select the third data.

In another of the broader forms of the embodiments discussed herein, an electron beam (e-beam) lithography tool is provided. (FIG. 1). The tool includes a pattern generator device (e.g., DPG 104) that includes a first pixel and a second pixel and a peripheral region having control circuitry for the pixels. Each of the first pixel and the second pixel receives a single data path. The single data path provides data from the control circuitry to the first and the second pixels.

In a further embodiment, the control circuitry includes a multiplexer that places data for the first pixel on a single data path and data for the second pixel on the single data path. In an embodiment, the control circuitry also includes a demultiplexer (demux) receiving a clock signal. The demux may provide a first clock signal to the first pixel and a second clock signal to the second pixel. In an embodiment, a first clock line is provided the first pixel and a second clock line is provided to the second pixel. See, e.g., FIGS. 6 and 7.

In another of the broader embodiments discussed herein, a method of lithography is described. The method includes receiving a first data and a second data. The first data may define a reflectivity status of a first pixel. The second data may define a reflectivity status of a second pixel. The first data is provided, aligned with a first clock signal, to the first pixel using a data line. The second data is provided, aligned with a second clock signal, to the second pixel using the same data line.

In a further embodiment, a third data is received that defines a reflectivity status of the first pixel. The third data is associated with a scan in a first direction and the first data is associated with a scan in a second direction (e.g., up, down, left, right, diagonal). An actual scan direction is then determined. This may be determined to be the second direction (thus, requiring the first data be provided to the pixel). The first data is then selected using a control circuit prior to sending the first data to the first pixel.

In another embodiment, a third data defining a reflectivity status of a third pixel is received as well as fourth data defining a reflectivity status of a fourth pixel. The third data, aligned with the first clock signal, is provided to the third pixel using a second data line. The fourth data, aligned with the second clock signal, is provided to the fourth pixel using the second data line.

In an embodiment, the first pixel receives the single data path and the first clock signal. The first pixel then stores the first data. In yet another embodiment, the method includes receiving a plurality of data including the first data and the second data. The plurality of data may be associated with a plurality of scan directions. The first data is determined to be for the first pixel and the second data is determined to be for the second pixel. The determining is performed by control circuitry prior to sending the first data to the first pixel It is understood that different embodiments disclosed herein offer different disclosure, and that they may make various changes, substitutions and alterations herein without departing from the spirit and scope of the present disclosure.

What is claimed is:

1. A system, comprising:
an electron source operable to produce a beam;
an array of pixels operable to pattern the beam; and
control circuitry spaced a distance from and coupled to the array of pixels, wherein the control circuitry uses time domain multiplex loading to control the array of pixels;
wherein the control circuitry includes:
a multiplexer;
a first data path coupled to the multiplexer and to a first pixel and a second pixel of the array of pixels; and
a first clock signal provided to a demultiplexer (demux), wherein the demux uses the first clock signal to generate a second clock signal provided to the first pixel and a third clock signal provided to the second pixel.

2. The system of claim 1, wherein the array of pixels is provided as a first group of pixels and a second group of pixels, wherein the first group of pixels shares the first data path and the second group of pixels shares a second data path.

3. The system of claim 2, wherein each of the pixels of the first group receives a separate clock signal.

4. The system of claim 1, wherein each pixel of the array of pixels receives a single data path and a single clock signal.

5. The system of claim 4, wherein each pixel of the array of pixels includes at least one of a register and a latch to receive data from the single data path and the single clock signal.

6. The system of claim 1, wherein the control circuitry includes:
circuitry operable to receive a first data associated with a right direction scan of the system and a second data associated with a left direction scan of the system;
shift logic circuitry operable to select one of the first and the second data; and
wherein the first data path for delivers the selected one of the first and the second data to the first pixel of the array of pixels.

7. The system of claim 6, wherein the circuitry is operable to receive a third data associated with one of an up direction, a down direction, and a diagonal direction scan of the system; and wherein the shift logic circuitry is operable to select the third data.

8. A system, comprising:
    an electron source operable to produce a beam;
    an array of pixels operable to pattern the beam; and
    control circuitry spaced a distance from and coupled to the array of pixels, wherein the control circuitry uses time domain multiplex loading to control the array of pixels and wherein the control circuitry includes:
        a first clock signal provided to a demultiplexer (demux), wherein the demux generates a plurality of clock signals used to provide data to the array of pixels.

9. The system of claim 8, wherein the control circuitry further includes:
    a multiplexer;
    a single data path coupled to the multiplexer and to a first pixel and a second pixel of the array of pixels; and
    wherein the plurality of clock signals include a second clock signal provided to the first pixel and a third clock signal provided to the second pixel.

10. The system of claim 8, wherein the array of pixels provides a first group of pixels and a second group of pixels, wherein the first group of pixels shares a first data path and the second group of pixels shares a second data path.

11. The system of claim 8, wherein each pixel of the array of pixels receives a single data path and a single clock signal.

12. The system of claim 8, wherein the control circuitry further includes:
    circuitry operable to receive a first data associated with a right direction scan of the system and a second data associated with a left direction scan of the system; shift logic circuitry operable to select one of the first and the second data; and
    a data path for delivering the selected one of the first and the second data to a first pixel of the array of pixels.

13. An electron beam (e-beam) lithography tool, comprising:
    a pattern generator device, including:
        a first pixel and a second pixel, wherein each of the first pixel and the second pixel share a single data path;
        a peripheral region having control circuitry for the first pixel and the second pixel, wherein the control circuitry comprises a demultiplexer receiving a first clock signal; and
        the single data path providing data from the control circuitry to the first and the second pixels.

14. The e-beam tool of claim 13, wherein the control circuitry includes a multiplexer that places data for the first pixel on the single data path and data for the second pixel on the single data path.

15. The e-beam tool of claim 13, wherein the demultiplexer provides a third clock signal to the first pixel and a second clock signal to the second pixel.

16. The e-beam tool of claim 15, wherein a first clock line is provided the first pixel and a second clock line is provided to the second pixel.

17. The e-beam tool of claim 13, wherein the demultiplexer is used to provide data to the first and second pixels.

18. The e-beam tool of claim 13, wherein the demultiplexer uses the first clock signal to generate a second clock signal provided to the first pixel and a third clock signal provided to the second pixel.

* * * * *